United States Patent
Chen et al.

(10) Patent No.: US 12,013,612 B2
(45) Date of Patent: Jun. 18, 2024

(54) BACKLIGHT MODULE AND LIQUID CRYSTAL DISPLAY DEVICE

(71) Applicant: WUHAN CHINA STAR OPTOELECTRONICS TECHNOLOGY CO., LTD, Hubei (CN)

(72) Inventors: Yunni Chen, Hubei (CN); Yong Yang, Hubei (CN); Fancheng Liu, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/597,204

(22) PCT Filed: Dec. 20, 2021

(86) PCT No.: PCT/CN2021/139767
§ 371 (c)(1),
(2) Date: Dec. 29, 2021

(87) PCT Pub. No.: WO2023/108687
PCT Pub. Date: Jun. 22, 2023

(65) Prior Publication Data
US 2024/0027829 A1    Jan. 25, 2024

(30) Foreign Application Priority Data
Dec. 14, 2021 (CN) .......................... 202111526172.9

(51) Int. Cl.
G02F 1/13357 (2006.01)
G02F 1/1335 (2006.01)

(52) U.S. Cl.
CPC .. *G02F 1/133605* (2013.01); *G02F 1/133603* (2013.01); *G02F 1/133607* (2021.01); *G02F 1/133614* (2021.01)

(58) Field of Classification Search
CPC ......... G02F 1/133605; G02F 1/133603; G02F 1/133607; G02F 1/133614; G02F 1/133611
See application file for complete search history.

(56) References Cited

U.S. PATENT DOCUMENTS

2016/0116663 A1    4/2016  Hong
2020/0379298 A1*  12/2020  Notoshi ............ G02F 1/133603
(Continued)

FOREIGN PATENT DOCUMENTS

CN    202600179 U    12/2012
CN    103548160 A  *  1/2014  ............... F21K 9/50
(Continued)

*Primary Examiner* — Erin Kryukova (57) ABSTRACT

The present application provides a backlight module and a liquid crystal display device; the backlight module is provided with a light control member between a light emitting chip and a color conversion film, and the light to be emitted to outside of the edge region of the backlight module is converged to the edge region of the backlight module, thereby improving the luminance of the edge region of the backlight module, avoiding the problem that the edge of the backlight module is darkened during display, and since the light will not be directly emitted to outside of the edge of the backlight module, the problem that the edge of the backlight module is bluish is alleviated.

19 Claims, 3 Drawing Sheets

(56) References Cited

U.S. PATENT DOCUMENTS

| | | | | |
|---|---|---|---|---|
| 2021/0074693 | A1* | 3/2021 | Sim | H01L 25/13 |
| 2021/0157204 | A1* | 5/2021 | Park | G02F 1/133605 |
| 2021/0263379 | A1* | 8/2021 | Lee | G02F 1/133606 |
| 2021/0302785 | A1* | 9/2021 | Nam | G02F 1/133605 |
| 2022/0413342 | A1* | 12/2022 | Qin | G02F 1/133608 |

FOREIGN PATENT DOCUMENTS

| | | |
|---|---|---|
| CN | 206038948 U | 3/2017 |
| CN | 207815079 U | 9/2018 |
| CN | 109143687 A | 1/2019 |
| CN | 109188781 A | 1/2019 |
| CN | 109407405 A | 3/2019 |
| CN | 214540312 U | 10/2021 |
| KR | 20200011329 A | 2/2020 |

\* cited by examiner

BACKLIGHT MODULE AND LIQUID CRYSTAL DISPLAY DEVICE

FIELD OF INVENTION

The present application relates to a display technology field, in particular to a backlight module and a liquid crystal display device.

BACKGROUND OF INVENTION

Mini-LED (Mini Light Emitting Diode) technology is widely used due to its advantages of high contrast, partition control, power saving, and the like. However, due to a limitation of edge light diffusion and a problem of a light leakage at an edge of a color conversion film in the conventional Mini-LED product, the luminance of the backlight at the edge position is lower than that at the in-plane region, and the white light color dot at the edge position is visually bluish compared with that at the in-plane region, resulting in poor display of the display panel.

Therefore, the existing Mini-LED display device has the technical problems of darkening and bluish display at the edges during display due to light leakage at the edges.

SUMMARY OF INVENTION

Technical Problem

Embodiments of the present application provide a backlight module and a liquid crystal display device for alleviating the technical problems of darkening and bluish display at the edges during display due to light leakage at the edges, in an existing Mini-LED display device.

Technical Solution

To solve the above problems, the present application provides the following technical solutions:

An embodiment of the present application provides a backlight module, the backlight module includes: a backlight substrate; a light emitting chip disposed at a side of the backlight substrate; a transparent adhesive disposed on a side of the light emitting chip away from the backlight substrate; a color conversion film disposed on a side of the transparent adhesive away from the light emitting chip; and an optical film sheet disposed on a side of the color conversion film away from the transparent adhesive. The backlight module comprises a middle region and an edge region located outside the middle region, a light control member is provided between the light emitting chip and the color conversion film in the edge region, and the light control member is used to converge light to be emitted to outside of the edge region of the backlight module to the edge region of the backlight module.

In some embodiments, the light control member comprises a micro-prism cover and a reverse micro-prism structure, the micro-prism cover is disposed on a light emitting side of the light emitting chip, the reverse micro-prism structure is disposed on a light incident side of the color conversion film, the micro-prism cover is disposed at a side of the reverse micro-prism structure away from the color conversion film, an angle at which light from the light emitting chip is emitted through the micro-prism cover is a first angle, and a difference between a prism angle of the reverse micro-prism structure and the first angle is less than a first preset value.

In some embodiments, the light emitting chip comprises a plurality of light emitting sub-chips, and in the edge region, the micro-prism cover is disposed on the light emitting sub-chip correspondingly, and the micro-prism cover is disposed between the light emitting sub-chip and the transparent adhesive.

In some embodiments, the reverse micro-prism structure is disposed between the color conversion film and the transparent adhesive, and a width of the reverse micro-prism structure is greater than a maximum width of the micro-prism cover.

In some embodiments, the color conversion film is formed with the reverse micro-prism structure on a side of the color conversion film close to the transparent adhesive, and the transparent adhesive is formed with a micro-prism structure corresponding to the reverse micro-prism structure.

In some embodiments, the light control member comprises a barrier structure disposed between the backlight substrate and the color conversion film, and a reflectivity of the barrier structure is greater than a second preset value.

In some embodiments, the barrier structure is disposed at a side of the light emitting chip away from the middle region, a height of the barrier structure is greater than a height of the light emitting chip, and a height of the barrier structure is less than a height of the transparent adhesive.

In some embodiments, the barrier structure comprises a base material disposed on the backlight substrate and a color conversion layer disposed around the base material.

In some embodiments, materials of the barrier structure comprise at least a reflective material and a color conversion material, the color conversion material and the reflective material are mixed to form the barrier structure.

In some embodiments, the optical film sheet comprises a diffusion sheet, the diffusion sheet is provided with an inverse prism structure in the edge region.

Meanwhile, an embodiment of the present application provides a liquid crystal display device comprising a liquid crystal display panel and a backlight module, the backlight module includes: a backlight substrate; a light emitting chip disposed at a side of the backlight substrate; a transparent adhesive disposed on a side of the light emitting chip away from the backlight substrate; a color conversion film disposed on a side of the transparent adhesive away from the light emitting chip; and an optical film sheet disposed on a side of the color conversion film away from the transparent adhesive. The backlight module comprises a middle region and an edge region located outside the middle region, a light control member is provided between the light emitting chip and the color conversion film in the edge region, and the light control member is used to converge light to be emitted to outside of the edge region of the backlight module to the edge region of the backlight module.

In some embodiments, the light control member comprises a micro-prism cover and a reverse micro-prism structure, the micro-prism cover is disposed on a light emitting side of the light emitting chip, the reverse micro-prism structure is disposed on a light incident side of the color conversion film, the micro-prism cover is disposed at a side of the reverse micro-prism structure away from the color conversion film, an angle at which light from the light emitting chip is emitted through the micro-prism cover is a first angle, and a difference between a prism angle of the reverse micro-prism structure and the first angle is less than a first preset value.

In some embodiments, the light emitting chip comprises a plurality of light emitting sub-chips, and in the edge region, the micro-prism cover is disposed on the light emitting sub-chip correspondingly, and the micro-prism cover is disposed between the light emitting sub-chip and the transparent adhesive.

In some embodiments, the reverse micro-prism structure is disposed between the color conversion film and the transparent adhesive, and a width of the reverse micro-prism structure is greater than a maximum width of the micro-prism cover.

In some embodiments, the color conversion film is formed with the reverse micro-prism structure on a side of the color conversion film close to the transparent adhesive, and the transparent adhesive is formed with a micro-prism structure corresponding to the reverse micro-prism structure.

In some embodiments, a height of prism of the reverse micro-prism structure gradually decreases in a direction extending from the edge region toward the middle region.

In some embodiments, the light control member comprises a barrier structure disposed between the backlight substrate and the color conversion film, and a reflectivity of the barrier structure is greater than a second preset value.

In some embodiments, the barrier structure is disposed at a side of the light emitting chip away from the middle region, a height of the barrier structure is greater than a height of the light emitting chip, and a height of the barrier structure is less than a height of the transparent adhesive.

In some embodiments, the barrier structure comprises a base material disposed on the backlight substrate and a color conversion layer disposed around the base material.

In some embodiments, materials of the barrier structure comprise at least a reflective material and a color conversion material, the color conversion material and the reflective material are mixed to form the barrier structure.

Advantageous Effects

The present application provides a backlight module and a liquid crystal display device; the backlight module includes a backlight substrate, a light emitting chip, a transparent adhesive, a color conversion film, and an optical film sheet, the light emitting chip is disposed at a side of the backlight substrate, the transparent adhesive is disposed at a side of the light emitting chip away from the backlight substrate, the color conversion film is disposed at a side of the transparent adhesive away from the light emitting chip, and the optical film sheet is disposed at a side of the color conversion film away from the transparent adhesive, wherein the backlight module includes a middle region and an edge region outside the middle region, and a light control member is provided between the light emitting chip and the color conversion film in the edge region, and the light control member is used to converge the light to be emitted to outside of the edge region of the backlight module to the edge region of the backlight module. In the present application, the light control member is provided between the light emitting chip and the color conversion film, and the light to be emitted to outside of the edge region of the backlight module is converged to the edge region of the backlight module, thereby improving the luminance of the edge region of the backlight module, avoiding the problem that the edge of the backlight module is darkened during display, and since the light will not be directly emitted to outside of the edge of the backlight module, the problem that the edge of the backlight module is bluish is alleviated.

DESCRIPTION OF DRAWINGS

The technical solutions and other beneficial effects of the present application will be apparent from the detailed description of the specific embodiments of the present application with reference to the accompanying drawings.

DETAILED DESCRIPTION OF EMBODIMENTS

Technical solutions in embodiments of the present application will be clearly and completely described below in conjunction with drawings in the embodiments of the present application. Obviously, the described embodiments are only a part of embodiments of the present application, rather than all the embodiments. Based on the embodiments in the present application, all other embodiments obtained by those skilled in the art without creative work fall within the protection scope of the present application.

In view of the technical problems of darkening and bluish display at the edges during display due to light leakage at the edges in an existing Mini-LED display device, an embodiment of the present application provides a backlight module and a liquid crystal display device for alleviating the above technical problems.

Figure 1:
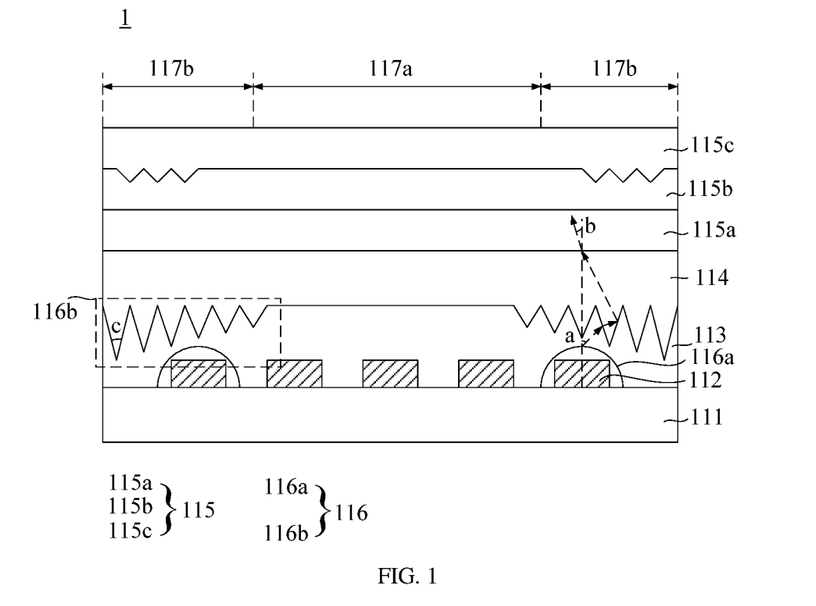
FIG. 1 is a first schematic diagram of a backlight module according to an embodiment of the present application.

As shown in FIG. 1, an embodiment of the present application provides a backlight module. The backlight module 1 includes: a backlight substrate 111; a light emitting chip 112 disposed on a side of the backlight substrate 111; a transparent adhesive 113 disposed on a side of the light emitting chip 112 away from the backlight substrate 111; a color conversion film 114 disposed on a side of the transparent adhesive 113 away from the light emitting chip 112; and an optical film sheet 115 disposed on a side of the color conversion film 114 away from the transparent adhesive 113. The backlight module 1 includes a middle region 117a and an edge region 117b located outside the middle region 117a, a light control member 116 is provided between the light emitting chip 112 and the color conversion film 114 in the edge region 117b, and the light control member 116 is used to converge the light to be emitted to the outside of the edge region 117b of the backlight module to the edge region 117b of the backlight module.

An embodiment of the present application provides a backlight module. The backlight module is provided with a light control member disposed between the light emitting chip and the color conversion film, so that the light to be emitted to outside of the edge region of the backlight module may be converged to the edge region of the backlight module, thereby improving the luminance of the edge region of the backlight module, avoiding the problem that the edge of the backlight module is darkened during display, and since the light will not be directly emitted to outside of the edge of the backlight module, the problem that the edge of the backlight module is bluish is alleviated.

It should be noted that the middle region in the embodiment of the present application refers to a region where the light may not diverge to the outside of the edge region of the backlight module, and the edge region refers to a region where the light may diverge to the outside of the edge region of the backlight module. Therefore, the embodiment of the present application does not limit specific dimensions of the middle region and the edge region. The edge region and the middle region may be determined according to different designs of the backlight module. For example, if the width of the region where the light may diverge to the outside of the edge region of the backlight module is 5 microns, the width of the edge region at one side can be set to 5 microns.

The angle of the light emitted from the light emitting chip is too large, which leads to the problem that the light leaks from the edge of the backlight module. In an embodiment, as shown in FIG. 1, the light control member 116 includes a micro-prism cover 116a and a reverse micro-prism structure 116b, the micro-prism cover 116a is disposed on a light emitting side of the light emitting chip 112, the reverse micro-prism structure 116b is disposed on a light incident side of the color conversion film 114, and the micro-prism cover 116a is disposed on a light incident side of the reverse micro-prism structure 116b away from the color conversion film 114. The angle at which the light emitted by the light emitting chip 112 is emitted through the micro-prism cover 116a is a first angle a, and a difference between the prism angle c of the reverse micro-prism structure 116b and the first angle a is less than a first preset value. The angle of the light emitted by the light emitting chip is controlled by the micro-prism cover and the reverse micro-prism structure, so that the light to be emitted to outside of the edge of the backlight module can be converged to the edge region, thereby increasing the luminance of the edge region and improving the problems of darkening and bluish display at the edges during display.

It should be noted that the reverse micro-prism structure means that a prism portion faces the light emitting chip and a bottom portion faces the optical film sheet.

It should be noted that in FIG. 1, since the color conversion film 114 and the transparent adhesive 113 are in direct contact with each other, in order to keep the backlight module flat, the color conversion film 114 and the transparent adhesive 113 are adaptively designed when the reverse micro-prism structure 116b is provided. Therefore, the reverse micro-prism structure 116b shown in FIG. 1 may be adaptively designed to be combined with the transparent adhesive 113, and a micro-prism structure of the transparent adhesive 113 is not denoted in FIG. 1.

It should be noted that in the present embodiment, the angle of light emitted from the light emitting chip is controlled by the cooperation of the micro-prism cover and the reverse micro-prism structure. Therefore, a light-emitting angle of light emitted from the light emitting chip and then passing through the micro-prism cover is made close to the prism angle of the reverse micro-prism structure, specifically, a difference between the prism angle of the reverse micro-prism structure and the first angle is made less than the first preset value, so that the light diverging outside the edge of the backlight module can be converged to the edge region of the backlight module.

Specifically, the first preset value is an angle value, and the first preset value ranges from 0 to 3 degrees, that is, the prism angle may be less than or equal to the first preset value, or may be greater than or equal to the first preset value, and the difference between the two may be less than or equal to 3.

It should be noted that the first angle refers to an included angle between the light passing through the micro-prism cover and a normal direction perpendicular to the backlight substrate, specifically, in FIG. 1, the first angle is the angle a; the prism angle refers to an angle of a convex structure, specifically, in FIG. 1, the prism angle is the angle c.

In an embodiment, the first angle ranges from 60 to 67 degrees. By controlling the first angle to 60 to 67 degrees, the light can be converged to the edge region of the backlight module after passing through the micro-prism cover and the reverse micro-prism structure, thereby improving the problems of darkening and bluish display at the edges during display.

Specifically, as shown in FIG. 1, after the light is emitted by the light emitting chip, the light passes through the micro-prism cover 116a, the transparent adhesive 113, the reverse micro-prism structure 116b, and the color conversion film 114, the light is emitted at an angle b, and the angle b can range from 0 to 5 degrees. As can be seen from FIG. 1, the light to be emitted to outside of the edge region of the backlight module may be converged to the edge region by controlling the angle of light in this embodiment of the present application, so that the luminance of the edge region is improved, and since the light may not be directly emitted to the outside of the edge region to cause the bluish display, the problems of darkening and bluish display at the edges during display are improved.

In an embodiment, as shown in FIG. 1, the light emitting chip 112 includes a plurality of light emitting sub-chips, in the edge region 117b, the micro-prism cover 116a is disposed on the corresponding light emitting sub-chip, and the micro-prism cover 116a is disposed between the light emitting sub-chip and the transparent adhesive 113. By arranging the micro-prism covers on the light emitting sub-chips, the angle of the light from each of the light emitting sub-chips can be precisely controlled, so that the light from the light emitting chip can be emitted at a preset angle, the light to be emitted to outside of the edge region of the backlight module may be converged to the edge region, thereby increasing the luminance of the edge region of the backlight module, and improving the problems of darkening and bluish display at the edges during display.

Specifically, the micro-prism cover is disposed directly on the light emitting sub-chip and around the light emitting sub-chip, so that the light emitted by the light emitting chip can be prevented from passing through other film layers or having been diverged, the light can be directly controlled to be emitted at a preset angle, and a larger volume of the micro prism cover and an increased thickness of the backlight module caused by the divergence of the light may not occur.

Specifically, only one micro-prism cover is shown in the edge region in FIG. 1, but the embodiment of the present application is not limited thereto. For example, if the edge region includes a plurality of columns and a plurality of rows of light emitting sub-chips, the micro-prism covers may be provided in a plurality of columns and a plurality of rows to control light in the edge region, thereby increasing the luminance of the edge region of the backlight module, and improving the problems of darkening and bluish display at the edges during display.

In an embodiment, in an edge region at one side of the middle region, the light control member includes at least two columns of micro-prism covers. That is, a plurality of columns or rows of micro-prism covers may be provided at each side of the middle region to control the light in the edge region, thereby increasing the luminance of the edge region of the backlight module, and improving the problems of darkening and bluish display at the edges during display.

The foregoing embodiment has been described in detail with the micro-prism cover correspondingly disposed on the light emitting sub-chip. However, the embodiments of the present application are not limited thereto, and for example, a single micro-prism cover may be disposed on a plurality of light emitting sub-chips.

In an embodiment, the reverse micro-prism structure is disposed between the color conversion film and the transparent adhesive, and the width of the reverse micro-prism structure is greater than the maximum width of the micro-prism cover. The light emitted from the light emitting chip may leak from the color conversion film, which resulting in darker display and bluish display at the edges of the display device when displaying, therefore, the reverse micro-prism structure is disposed between the color conversion film and the transparent adhesive so that the light has been converged to the edge region of the backlight module without leaking from the edge of the color conversion film when passing through the color conversion film; and by making the width of the reverse micro-prism structure greater than the maximum width of the micro-prism cover, the light passing through the micro-prism cover can pass through the reverse micro-prism structure, so that the light diverging out of the edge region may be converged to the edge region of the backlight module by controlling the angle of the light by the micro-prism cover and the reverse micro-prism structure.

It should be noted that the maximum width of the micro-prism cover refers to the width of the micro-prism in a direction from the edge region to the middle region when the micro-prism cover is a single micro-prism, and when there are a plurality of micro-prism covers, the maximum width of the micro-prism cover refers to the distance between the micro-prism cover closest to the outside of the edge region and the micro-prism cover closest to the middle region in the direction from the edge region to the middle region.

Specifically, the reverse micro-prism structure extends from the outermost side of the edge region toward the middle region. That is, when the reverse micro-prism structure is disposed, since the light may diverge to outside of the edge region, the reverse micro-prism structure is disposed to extend from the outermost side of the edge region to the middle region when providing the reverse micro-prism structure, so that the light that diverges to outside of the edge region will surely pass through the reverse micro-prism structure when the light passes through the color conversion film, thereby controlling the angle of the light, preventing the light from diverging to outside of the edge region of the backlight module, and improving the problems of darkening and bluish display at the edges during display.

In an embodiment, the backlight module includes the reverse micro-prism structure layer, the reverse micro-prism structure layer is provided with a reverse micro-prism structure, the reverse micro-prism structure layer is disposed between the color conversion film and the transparent adhesive. The reverse micro-prism structure layer is provided so as not to affect other preparation processes of the backlight module. The reverse micro-prism structure layer is formed between the color conversion film and the transparent adhesive to control light, so as to prevent the light from diverging to outside of the edge region of the backlight module, and improve the problems of darkening and bluish display at the edges during display.

In an embodiment, as shown in FIG. 1, the color conversion film 114 is formed with a reverse micro-prism structure 116b at a side of the color conversion film 114 close to the transparent adhesive 113, and the transparent adhesive 113 is formed with a micro-prism structure corresponding to the reverse micro-prism structure 116b. That is, when the reverse micro-prism structure is formed, the reverse micro-prism structure is formed by direct imprinting without rearranging the film layer, the preparation processes of the backlight module are reduced, the preparation efficiency of the backlight module is improved, and the thickness of the backlight module is not increased by such arrangement.

In an embodiment, as shown in FIG. 1, a height of prism of the reverse micro-prism structure 116b gradually decreases in the direction extending from the edge region 117b toward the middle region 117a. During the divergence of light, the light emission angles of the light emitting chip located at the edge converges sequentially in the direction from the edge region toward the middle region. Even if the angle of the light is changed through the micro-prism cover so that the angles of the emitted light are similar or the same, since the emission path of the light close to the outside of the edge region is longer, it is easier for the light to diverge to the outside of the edge region of the backlight module, therefore, the height of the prism of the reverse micro-prism structure located at the edge region may be higher, so that even if the light emission angles of the light are the same, the light can be emitted to the reverse micro-prism structure in the edge region, thereby controlling the light diverging to the outside of the edge region, preventing the light from diverging to the outside of the edge region of the backlight module, and improving the problems of darkening and bluish display at the edges during display.

Specifically, the width of the reverse micro-prism structure ranges from 1 mm to 5 mm. When the reverse micro-prism structure is provided, the width of the reverse micro-prism structure is set so as to be capable of receiving light from the micro-prism cover, and it is avoided that the width of the reverse micro-prism structure is too large, which affects the normal display of the middle region.

Specifically, the thickness of the transparent adhesive ranges from 200 microns to 400 microns.

Specifically, the reverse micro-prism structure has a thickness ranging from 50 microns to 250 microns. It should be noted that the thickness of the reverse micro-prism structure may refer to a plurality of thicknesses for a single reverse micro-prism structure or a plurality of thicknesses for different reverse micro-prism structures.

Figure 2:
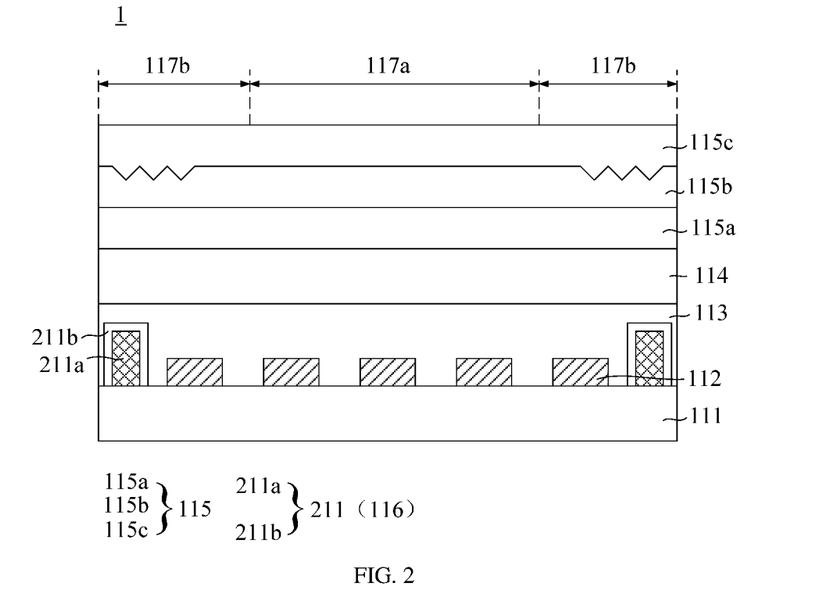
FIG. 2 is a second schematic diagram of a backlight module according to an embodiment of the present application.

In an embodiment, as shown in FIG. 2, the light control member 116 includes a barrier structure 211, the barrier structure 211 is disposed between the backlight substrate 111 and the color conversion film 114 and has a reflectivity greater than a second preset value. The barrier structure is provided between the backlight substrate and the color conversion film, and the reflectivity of the barrier structure is greater than the second preset value, so that the barrier structure can reflect the light to be emitted to outside of the edge region of the backlight module to the edge region, and the barrier structure can also reflect the light reflected by the color conversion film to the color conversion film, thereby preventing the light from leaking out of the edge region of the backlight module, improving the utilization rate of the light, increasing the luminance of the edge region, and improving the problems of darkening and bluish display at the edges during display.

It should be noted that the second preset value refers to a value of reflectivity that can reflect light to the color conversion film. This value can be set according to requirements. However, the higher the reflectivity, the higher the utilization rate of the light. Therefore, the value of the reflectivity may be set to be higher, for example, the second preset value is 95%.

Light emitted for the light emitting chip is emitted laterally and then diverged outside the edge region of the backlight module. In an embodiment, as shown in FIG. 2, the barrier structure 211 is disposed at a side of the light emitting chip 112 away from the middle region 117a, a height of the barrier structure 211 is greater than a height of the light emitting chip 112, and the height of the barrier structure 211 is less than a height of the transparent adhesive 113. By making the height of the barrier structure greater than the height of the light emitting chip, the light diffused to the outside of the edge region of the backlight module is blocked by the barrier structure during the upward divergence of the light, and because the barrier structure reflects the light, the luminance of the edge region is increased, and the problems of darkening and bluish display at the edges during display are improved. By making the height of the barrier structure less than the height of the transparent adhesive, the barrier structure is prevented from being exposed to damage to the color conversion film, and a problem of a poor adhesion between the barrier structure and the color conversion film is avoided.

Specifically, the barrier structure is provided at a side of the light emitting chip away from the middle region, when the light diverges toward the edge region, the light is irradiated onto the barrier structure and reflected by the barrier structure, thereby preventing the light from being reflected outside the edge area of the backlight module.

The above-described embodiment is described in detail with an example in which the height of the barrier structure is less than the height of the transparent adhesive. However, the embodiment of the present application is not limited thereto. In order to improve the blocking effect, the height of the barrier structure may be greater than or equal to the height of the transparent adhesive.

In view of the problem that the light at the edge region of the backlight module are bluish, in an embodiment, as shown in FIG. 2, the barrier structure 211 includes a base material 211a disposed on the backlight substrate 111 and a color conversion layer 211b disposed around the base material 211a. The barrier structure is provided as the base material and the color conversion film, so that the color conversion film can convert the blue light that is diverged or reflected back into red light or green light, thereby improving a problem of the bluish display at the edge region of the display module during display. Since the base material can reflect the light back to the color conversion film, leakage of the light from the edge region of the backlight module is avoided, the problem of the bluish display at the edge region of the display module is further avoided, and the luminance of the edge region of the backlight module is improved. In addition, the light reflected back from the color conversion film can be reflected back to the color conversion film again, so that the utilization rate of the light is improved, and the luminance of the edge region of the backlight module is improved.

In an embodiment, the material of the barrier structure includes at least a reflective material and a color conversion material, the color conversion material and the reflective material are mixed to form the barrier structure. The barrier structure is formed by using the reflective material and the color conversion material, so that when the light is diffused to the barrier structure or reflected to the barrier structure, the color conversion material in the barrier structure can convert blue light into red light and green light, and the reflective material in the barrier structure can reflect the light back to the color conversion film, thereby avoiding the problem of the bluish display at the edge region of the display module, increasing the luminance of the edge region of the backlight module, and improving the problem of darkening at the edge region of the backlight module.

Specifically, the material of the barrier structure includes a transparent glue, a color conversion material, and highly reflective ions, and the barrier structure is formed by the above-mentioned material, so that the barrier structure can convert the color of the light and reflect the light, thereby increasing the utilization rate of the light, increasing the luminance of the edge region, and improving the problem of darkening and bluish display at the edge region of the display module.

In an embodiment, the width of the barrier structure is greater than one-half of an interval between the light emitting chips, and the width of the barrier structure is less than the interval between the light emitting chips. By providing that the width of the barrier structure is greater than one-half of the interval between the light emitting chips, and that the width of the barrier structure is less than the interval between the light emitting chips, light is prevented from being emitted from the blocking structure, and the barrier structure is prevented from affecting the arrangement of the light emitting chips.

In an embodiment, as shown in FIG. 2, the barrier structures 211 in the edge region 117b located at one side of the middle region 117a are arranged in a column. However, the embodiment of the present application is not limited thereto. For example, the barrier structures in the edge region located at one side of the middle region are arranged in a plurality of columns and/or rows, and the light may be blocked by the plurality of columns of barrier structures, so that the light of the backlight module are prevented from leaking out of the edge region, and the problem of darkening and bluish display at the edge region of the display module is improved.

In an embodiment, the refractive index of the color conversion film is greater than the refractive index of the transparent adhesive, thereby enabling light to be converged and improving the problems of darkening and bluish display at the edge region of the display module.

In the above embodiments, the light control member including the micro-prism cover and the reverse micro-prism structure and the light control member including the barrier structure are described in detail. It should be noted that the embodiments of the present application are not limited to certain drawings, and under the premise that there is no conflict between one embodiment and another embodiment, the technical solutions of the plurality of embodiments may be combined to improve the problem of darkening and bluish display at the edge region of the display module. The embodiments of the present application are not illustrated one by one.

Figure 3:
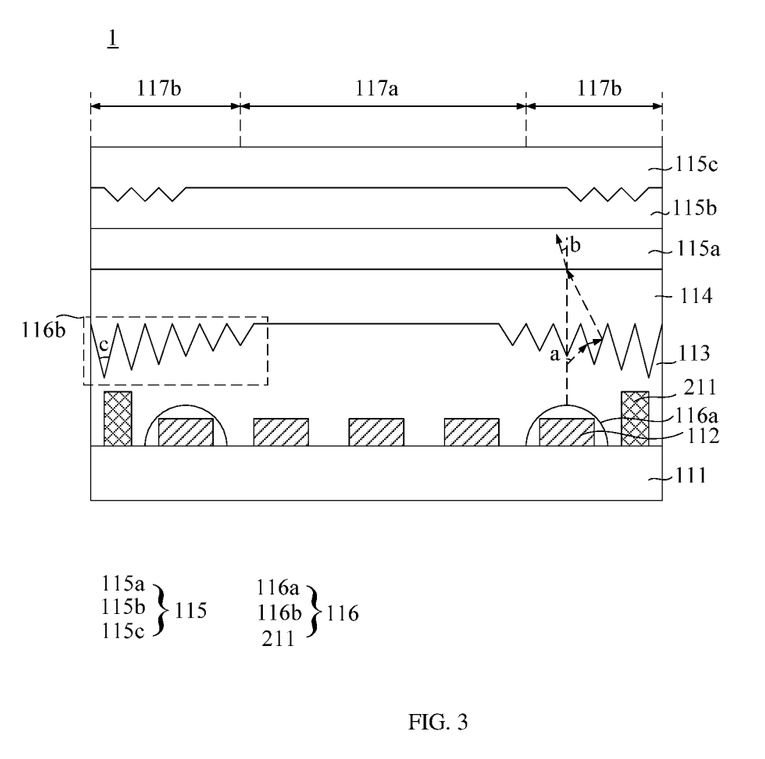
FIG. 3 is a third schematic diagram of a backlight module according to an embodiment of the present application.

In an embodiment, as shown in FIG. 3, the light control member 116 includes a micro-prism cover 116a, a reverse micro-prism structure 116b, and a barrier structure 211, the micro-prism cover 116a is disposed at the light emitting side of the light emitting chip 112, the reverse micro-prism structure 116b is disposed at the light incident side of the color conversion film 114, and the micro-prism cover 116a is disposed on the side of the reverse micro-prism structure 116b away from the color conversion film 114. An angle at which the light from the light emitting chip 112 is emitted through the micro-prism cover 116a is a first angle a, the difference between the prism angle c of the reverse micro-prism structure 116b and the first angle a is less than a first preset value, the barrier structure 211 is disposed between the backlight substrate 111 and the color conversion film 114, and the reflectivity of the barrier structure 211 is greater than a second preset value. By providing the micro-prism cover, the reverse micro-prism structure, and the barrier structure between the backlight substrate and the color conversion film, the angle of the light emitted by the light emitting chip is controlled by the micro-prism cover and the reverse micro-prism structure, so that the light to be emitted to outside of the edge of the backlight module can be converged to the edge region, and by providing the barrier structure between the backlight substrate and the color conversion film, and making the reflectivity of the barrier structure greater than the second preset value, the barrier structure can reflect the light to be emitted to outside of the edge region of the backlight module to the edge region, and the barrier structure can also reflect the light reflected by the color conversion film back to the color conversion film, so that the light is prevented from leaking out of the edge region of the backlight module, the utilization rate of the light is improved, the luminance of the edge region is increased, and the problems of darkening and bluish display at the edges during display are improved.

Specifically, the specific arrangement of the micro-prism cover, the reverse micro-prism structure, and the barrier structure may be a specific structure of any of the micro-prism cover, the reverse micro-prism structure, and the barrier structure or a combination of multiple specific structures described in the embodiments of this application, and details are not described herein again.

In an embodiment, the light emitting chip includes a blue light emitting chip, specifically a blue Mini-LED light emitting chip, and the light emitted by the blue Mini-LED light emitting chip is blue light.

In an embodiment, the material of the transparent adhesive includes thermosetting silicone.

In an embodiment, the color conversion film includes a fluorescent glue or a quantum dot glue, specifically, the fluorescent glue is formed by mixing a fluorescent powder material and glue, and the quantum dot glue is formed by mixing a quantum dot material and glue.

Specifically, the thickness of the color conversion film ranges from 100 microns to 400 microns.

Specifically, when the light emitting chip is a blue light emitting chip, the color conversion film includes a red light conversion material and a green light conversion material, for example, red light quantum dots and green light quantum dots.

In an embodiment, as shown in FIG. 1, the optical film sheet 115 includes a light-homogenizing film 115a, a prism sheet 115b, and a diffusion sheet 115c, the light-homogenizing film 115a is disposed on a side of the diffusion sheet 115c close to the color conversion film 114, the prism sheet 115b is disposed between the light-homogenizing film 115a and the diffusion sheet 115c. The uniformity of the display screen during display is improved by providing the light-homogenizing film, the diffusion sheet, and the prism sheet for processing light.

Specifically, the light-homogenizing film is used to shield the light shadow of the light-emitting chip and mix the light emitted by the light emitting chip uniformly. The prism sheet is used to condense the light so that the light outputted from the backlight module can obtain a gain in the direction of the front viewing angle. The diffusion sheet is used to eliminate the adsorption between the optical film and the substrate of the display panel and improve the Newton's ring phenomenon to perform the light-homogenizing.

In an embodiment, as shown in FIG. 1, the diffusion sheet 115c is provided with an inverse prism structure at the edge region, and by providing the inverse prism structure, the light in the edge region is converged, so that the luminance at the front viewing angle of the backlight at the edge position is further enhanced, and the problems of darkening and bluish display in the edge region of the display module are improved.

Specifically, the reverse micro-prism structure according to the embodiment of the present application may be formed by an imprinting process, a photolithography process, or an injection molding process.

It should be noted that, for the current scheme of increasing the luminance at edges by driving and controlling the light emitting chip at edge independently, this scheme has a higher requirement on the algorithm and is not easy to control. This scheme cannot improve the problem of bluish display at the edges caused by the light leakage at the edges. As for the scheme of using a yellow plastic frame or a silkscreen color conversion material at an edge of the film sheet, the luminance at edges is further reduced. In view of the problems in the prior art, the backlight module and the liquid crystal display panel described in the embodiments of the present application are provided, and the problems of darkening and bluish display at the edges during display can be improved simultaneously.

Figure 4:
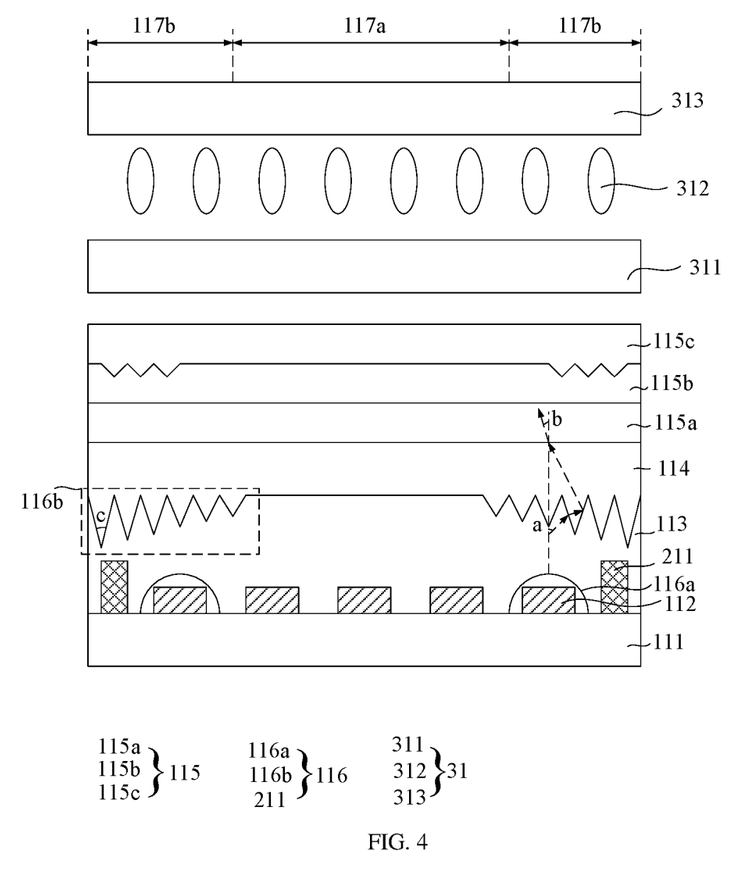
FIG. 4 is a schematic diagram of a liquid crystal display device according to an embodiment of the present application.

Meanwhile, as shown in FIG. 4, an embodiment of the present application provides a liquid crystal display device including a liquid crystal display panel 31 and a backlight module, the backlight module includes: a backlight substrate 111; a light emitting chip 112 disposed on a side of the backlight substrate 111; a transparent adhesive 113 disposed on a side of the light emitting chip 112 away from the backlight substrate 111; a color conversion film 114 disposed on a side of the transparent adhesive 113 away from the light emitting chip 112; and an optical film sheet 115 disposed on a side of the color conversion film 114 away from the transparent adhesive 113. The backlight module 1 includes a middle region 117a and an edge region 117b located outside the middle region 117a, a light control member 116 is provided between the light emitting chip 112 and the color conversion film 114 in the edge region 117b, and the light control member 116 is used to converge the light to be emitted to the outside of the edge region 117b of the backlight module to the edge region 117b of the backlight module.

An embodiment of the present application provides a liquid crystal display device including a liquid crystal display panel and a backlight module. The backlight module is provided with a light control member disposed between the light emitting chip and the color conversion film, so that the light to be emitted to outside of the edge region of the backlight module may be converged to the edge region of the backlight module, thereby improving the luminance of the edge region of the backlight module, avoiding the problem that the edge of the backlight module is darkened during display, and since the light will not be directly emitted to outside of the edge of the backlight module, the problem that the edge of the backlight module is bluish is alleviated.

In an embodiment, the liquid crystal display panel 31 includes a first substrate 311, a second substrate 313, and a liquid crystal layer 312 disposed between the first substrate 311 and the second substrate 313.

In an embodiment, the first substrate is an array substrate, and the second substrate is a color filter substrate.

In an embodiment, the first substrate is a color on array (COA) substrate.

In an embodiment, in a liquid crystal display device, the light control member includes a micro-prism cover and a reverse micro-prism structure, the micro-prism cover is disposed on a light emitting side of the light emitting chip, the reverse micro-prism structure is disposed on a light incident side of the color conversion film, and the micro-prism cover is disposed on a side of the reverse micro-prism structure away from the color conversion film. The angle at which the light emitted by the light emitting chip is emitted through the micro-prism cover is a first angle a, and a difference between the prism angle c of the reverse micro-prism structure and the first angle a is less than a first preset value.

In an embodiment, in a liquid crystal display device, the light emitting chip includes a plurality of light emitting sub-chips, in the edge region, the micro-prism cover is disposed on the corresponding light emitting sub-chip, and the micro-prism cover is disposed between the light emitting sub-chip and the transparent adhesive.

In an embodiment, in a liquid crystal display device, the reverse micro-prism structure is disposed between the color conversion film and the transparent adhesive, and the width of the reverse micro-prism structure is greater than the maximum width of the micro-prism cover.

In an embodiment, in the liquid crystal display device, the color conversion film is formed with a reverse micro-prism structure on the side close to the transparent adhesive, and the transparent adhesive is formed with a micro-prism structure corresponding to the reverse micro-prism structure.

In an embodiment, a height of prism of the reverse micro-prism structure gradually decreases in the direction extending from the edge region toward the middle region.

In an embodiment, in a liquid crystal display device, the light control member includes a barrier structure, the barrier structure is disposed between the backlight substrate and the color conversion film and has a reflectivity greater than a second preset value.

In an embodiment, in a liquid crystal display device, the barrier structure is disposed at a side of the light emitting chip away from the middle region, a height of the barrier structure is greater than a height of the light emitting chip, and the height of the barrier structure is less than a height of the transparent adhesive.

In an embodiment, in a liquid crystal display device, the barrier structure includes a base material disposed on the backlight substrate and a color conversion layer disposed around the base material.

In an embodiment, in a liquid crystal display device, the material of the barrier structure includes at least a reflective material and a color conversion material, the color conversion material and the reflective material are mixed to form the barrier structure.

In an embodiment, the light control member includes a micro-prism cover, a reverse micro-prism structure, and a barrier structure, the micro-prism cover is disposed at the light emitting side of the light emitting chip, the reverse micro-prism structure is disposed at the light incident side of the color conversion film, and the micro-prism cover is disposed on the side of the reverse micro-prism structure away from the color conversion film. An angle at which the light from the light emitting chip is emitted through the micro-prism cover is a first angle a, the difference between the prism angle c of the reverse micro-prism structure and the first angle a is less than a first preset value, the barrier structure is disposed between the backlight substrate and the color conversion film, and the reflectivity of the barrier structure is greater than a second preset value.

Based on the above embodiments of the present application provide a backlight module and a liquid crystal display device; the backlight module includes a backlight substrate, a light emitting chip, a transparent adhesive, a color conversion film, and an optical film sheet, the light emitting chip is disposed at a side of the backlight substrate, the transparent adhesive is disposed at a side of the light emitting chip away from the backlight substrate, the color conversion film is disposed at a side of the transparent adhesive away from the light emitting chip, and the optical film sheet is disposed at a side of the color conversion film away from the transparent adhesive, wherein the backlight module includes a middle region and an edge region outside the middle region, and a light control member is provided between the light emitting chip and the color conversion film in the edge region, and the light control member is used to converge the light to be emitted to outside of the edge region of the backlight module to the edge region of the backlight module.

In the present application, the light control member is provided between the light emitting chip and the color conversion film, and the light to be emitted to outside of the edge region of the backlight module is converged to the edge region of the backlight module, thereby improving the luminance of the edge region of the backlight module, avoiding the problem that the edge of the backlight module is darkened during display, and since the light will not be directly emitted to outside of the edge of the backlight module, the problem that the edge of the backlight module is bluish is alleviated.

In the above-described embodiments, the description of each of the various embodiments has its own focus, and portions of some embodiments that are not described in detail may be referred to the related descriptions of other embodiments.

A backlight module and a liquid crystal display device provided in the embodiments of the present application are described in detail above. Specific examples are used in this article to illustrate the principles and implementations of the present disclosure. The above description of the embodiments is merely intended to help understand the technical solutions and core ideas of the present application. Those of ordinary skill in the art will appreciate that they may still modify the technical solutions described in the foregoing embodiments, or equivalently replace some of the technical features therein; these modifications or substitutions do not deviate the nature of the respective solutions from the scope of the technical solutions of the embodiments of the present application.

What is claimed is:

1. A backlight module comprising:
   a backlight substrate;
   a light emitting chip disposed at a side of the backlight substrate;
   a transparent adhesive disposed on a side of the light emitting chip away from the backlight substrate;
   a color conversion film disposed on a side of the transparent adhesive away from the light emitting chip; and
   an optical film sheet disposed on a side of the color conversion film away from the transparent adhesive;
   wherein the backlight module comprises a middle region and an edge region located outside the middle region, a light control member is provided between the light emitting chip and the color conversion film in the edge region, and the light control member is used to converge light to be emitted to outside of the edge region of the backlight module to the edge region of the backlight module, and
   wherein the light control member comprises a micro-prism cover and a reverse micro-prism structure, the micro-prism cover is disposed on a light emitting side of the light emitting chip, the reverse micro-prism structure is disposed on a light incident side of the color conversion film, the micro-prism cover is disposed at a side of the reverse micro-prism structure away from the color conversion film, an angle at which light from the light emitting chip is emitted through the micro-prism cover is a first angle, and a difference between a prism angle of the reverse micro-prism structure and the first angle is less than a first preset value.

2. The backlight module according to claim 1, wherein the light emitting chip comprises a plurality of light emitting sub-chips, and in the edge region, the micro-prism cover is disposed on the light emitting sub-chip correspondingly, and the micro-prism cover is disposed between the light emitting sub-chip and the transparent adhesive.

3. The backlight module according to claim 1, wherein the reverse micro-prism structure is disposed between the color conversion film and the transparent adhesive, and a width of the reverse micro-prism structure is greater than a maximum width of the micro-prism cover.

4. The backlight module according to claim 3, wherein the color conversion film is formed with the reverse micro-prism structure on a side of the color conversion film close to the transparent adhesive, and the transparent adhesive is formed with a micro-prism structure corresponding to the reverse micro-prism structure.

5. The backlight module according to claim 4, wherein a height of prism of the reverse micro-prism structure gradually decreases in a direction extending from the edge region toward the middle region.

6. The backlight module according to claim 1, wherein the light control member further comprises a barrier structure disposed between the backlight substrate and the color conversion film, and a reflectivity of the barrier structure is greater than a second preset value.

7. The backlight module according to claim 6, wherein the barrier structure is disposed at a side of the light emitting chip away from the middle region, a height of the barrier structure is greater than a height of the light emitting chip, and a height of the barrier structure is less than a height of the transparent adhesive.

8. The backlight module according to claim 6, wherein the barrier structure comprises a base material disposed on the backlight substrate and a color conversion layer disposed around the base material.

9. The backlight module according to claim 6, wherein materials of the barrier structure comprise at least a reflective material and a color conversion material, the color conversion material and the reflective material are mixed to form the barrier structure.

10. The backlight module according to claim 1, wherein the optical film sheet comprises a diffusion sheet, the diffusion sheet is provided with an inverse prism structure in the edge region.

11. A liquid crystal display device comprising a liquid crystal display panel and a backlight module, wherein the backlight module comprises:
a backlight substrate;
a light emitting chip disposed at a side of the backlight substrate;
a transparent adhesive disposed on a side of the light emitting chip away from the backlight substrate;
a color conversion film disposed on a side of the transparent adhesive away from the light emitting chip; and
an optical film sheet disposed on a side of the color conversion film away from the transparent adhesive;

wherein the backlight module comprises a middle region and an edge region located outside the middle region, a light control member is provided between the light emitting chip and the color conversion film in the edge region, and the light control member is used to converge light to be emitted to outside of the edge region of the backlight module to the edge region of the backlight module, and wherein the light control member comprises a micro-prism cover and a reverse micro-prism structure, the micro-prism cover is disposed on a light emitting side of the light emitting chip, the reverse micro-prism structure is disposed on a light incident side of the color conversion film, the micro-prism cover is disposed at a side of the reverse micro-prism structure away from the color conversion film, an angle at which light from the light emitting chip is emitted through the micro-prism cover is a first angle, and a difference between a prism angle of the reverse micro-prism structure and the first angle is less than a first preset value.

12. The liquid crystal display device according to claim 11, wherein the light emitting chip comprises a plurality of light emitting sub-chips, and in the edge region, the micro-prism cover is disposed on the light emitting sub-chip correspondingly, and the micro-prism cover is disposed between the light emitting sub-chip and the transparent adhesive.

13. The liquid crystal display device according to claim 11, wherein the reverse micro-prism structure is disposed between the color conversion film and the transparent adhesive, and a width of the reverse micro-prism structure is greater than a maximum width of the micro-prism cover.

14. The liquid crystal display device according to claim 13, wherein the color conversion film is formed with the reverse micro-prism structure on a side of the color conversion film close to the transparent adhesive, and the transparent adhesive is formed with a micro-prism structure corresponding to the reverse micro-prism structure.

15. The liquid crystal display device according to claim 14, wherein a height of prism of the reverse micro-prism structure gradually decreases in a direction extending from the edge region toward the middle region.

16. The liquid crystal display device according to claim 11, wherein the light control member further comprises a barrier structure disposed between the backlight substrate and the color conversion film, and a reflectivity of the barrier structure is greater than a second preset value.

17. The liquid crystal display device according to claim 16, wherein the barrier structure is disposed at a side of the light emitting chip away from the middle region, a height of the barrier structure is greater than a height of the light emitting chip, and a height of the barrier structure is less than a height of the transparent adhesive.

18. The liquid crystal display device according to claim 16, wherein the barrier structure comprises a base material disposed on the backlight substrate and a color conversion layer disposed around the base material.

19. The liquid crystal display device according to claim 16, wherein materials of the barrier structure comprise at least a reflective material and a color conversion material, the color conversion material and the reflective material are mixed to form the barrier structure.

* * * * *